United States Patent
Chen

(10) Patent No.: US 9,368,507 B2
(45) Date of Patent: Jun. 14, 2016

(54) SEMICONDUCTOR STRUCTURE

(71) Applicant: MACRONIX INTERNATIONAL CO., LTD., Hsinchu (TW)

(72) Inventor: Shih-Hung Chen, Hsinchu County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 154 days.

(21) Appl. No.: 14/093,072

(22) Filed: Nov. 29, 2013

(65) Prior Publication Data
US 2015/0155388 A1 Jun. 4, 2015

(51) Int. Cl.
*H01L 27/105* (2006.01)
*H01L 27/115* (2006.01)
*G11C 16/04* (2006.01)

(52) U.S. Cl.
CPC .... *H01L 27/11556* (2013.01); *H01L 27/11565* (2013.01); *H01L 27/11578* (2013.01); *G11C 16/0483* (2013.01)

(58) Field of Classification Search
CPC ............. H01L 27/10811; H01L 27/11565; H01L 27/11519; H01L 27/11551; G11C 5/063; G11C 16/24
See application file for complete search history.

(56) References Cited

U.S. PATENT DOCUMENTS

| 8,383,512 | B2 | 2/2013 | Chen et al. | |
|---|---|---|---|---|
| 8,503,213 | B2 | 8/2013 | Chen et al. | |
| 2010/0258947 | A1* | 10/2010 | Jeong | H01L 27/115 257/774 |
| 2014/0008715 | A1* | 1/2014 | Sakuma | H01L 27/11551 257/324 |
| 2014/0151783 | A1* | 6/2014 | Park | H01L 27/11551 257/324 |
| 2015/0048440 | A1* | 2/2015 | Sakuma | H01L 27/11519 257/326 |

FOREIGN PATENT DOCUMENTS

TW 201232554 8/2012

* cited by examiner

*Primary Examiner* — Matthew W Such
*Assistant Examiner* — Scott Stowe
(74) *Attorney, Agent, or Firm* — McClure, Qualey & Rodack, LLP

(57) ABSTRACT

A semiconductor device comprises a plurality of stacking blocks and a plurality of conductive lines. Each stacking blocks comprises two opposite finger VG structures. Each finger VG structure includes a staircase structure and a plurality of bit line stacks. The staircase structure is perpendicular to the bit line stacks, and the bit line stacks of the two opposite finger VG structures are arranged alternately. The conductive lines is disposed over the stacking blocks at interval. The direction of the conductive lines is parallel to a direction of the bit line stacks. The conductive lines include a plurality of bit lines and a plurality of ground lines, and each stacking block includes at least one ground line.

7 Claims, 7 Drawing Sheets

SEMICONDUCTOR STRUCTURE

BACKGROUND

1. Technical Field

The disclosure relates in general to a semiconductor structure, and more particularly to a semiconductor structure designed for memory device with bit lines and ground lines.

2. Description of the Related Art

In typical MOSFET (metal-oxide-semiconductor field-effect transistor), the bulk end (body or substrate) and the source end have the same electric potential, and the voltage of source-body junction is zero.

However, the bulk end and the source end may not connect directly in some circuit design. In this situation, the extra loading in circuit may generate bias at source end ($V_S$), resulting in changes in threshold voltage ($V_T$). This phenomenon is called body effect.

When a plurality of transistors are connected in series (such as the bit lines in memory device), the body effect may significantly change the VT of transistor, influences the character of circuit. Thus, it is necessary to diminish the body effect. The traditional flash memory will introduce huge metal ground lines for diminishing the body effect. Nevertheless, the huge metal ground lines in prior art not only take the effective area of circuit, but also influence the nearby bit line. The electrical character of bit lines being adjacent to the ground lines will be changed by loading effect and coupling effect of surrounding circuit. Therefore, bit lines being adjacent to the ground lines have to be designed as dummy line, which increases the manufacturing cost.

SUMMARY

The disclosure is directed to a semiconductor structure with specific ground lines and bit lines arrangement, which is capable of reducing the area of ground line and maintain the electrical property of the structure.

According to one embodiment, a semiconductor device is provided. The semiconductor device comprises a plurality of stacking blocks and a plurality of conductive lines. Each stacking blocks comprises two opposite finger VG structures. Each finger VG structure includes a staircase structure and a plurality of bit line stacks. The staircase structure is perpendicular to the bit line stacks, and the bit line stacks of the two opposite finger VG structures are arranged alternately. The conductive lines are disposed over the stacking blocks at intervals. The direction of the conductive lines is parallel to a direction of the bit line stacks. The conductive lines include a plurality of bit lines and a plurality of ground lines, and each stacking block includes at least one ground line.

According to another embodiment, a semiconductor is provided. A semiconductor structure comprises a substrate, a plurality of memory cells and a plurality of conductive lines. The memory cells are disposed on the substrate and arranged in rows and columns. The conductive lines are disposed on the memory cells and are parallel to each other and space apart at a fixed interval. The conductive lines include a plurality of bit lines and a plurality of ground lines. The conductive lines are electrically connected to the memory cells The above and other aspects of the disclosure will become better understood with regard to the following detailed description of the non-limiting embodiment(s). The following description is made with reference to the accompanying drawings.

DETAILED DESCRIPTION

Figure 1A:
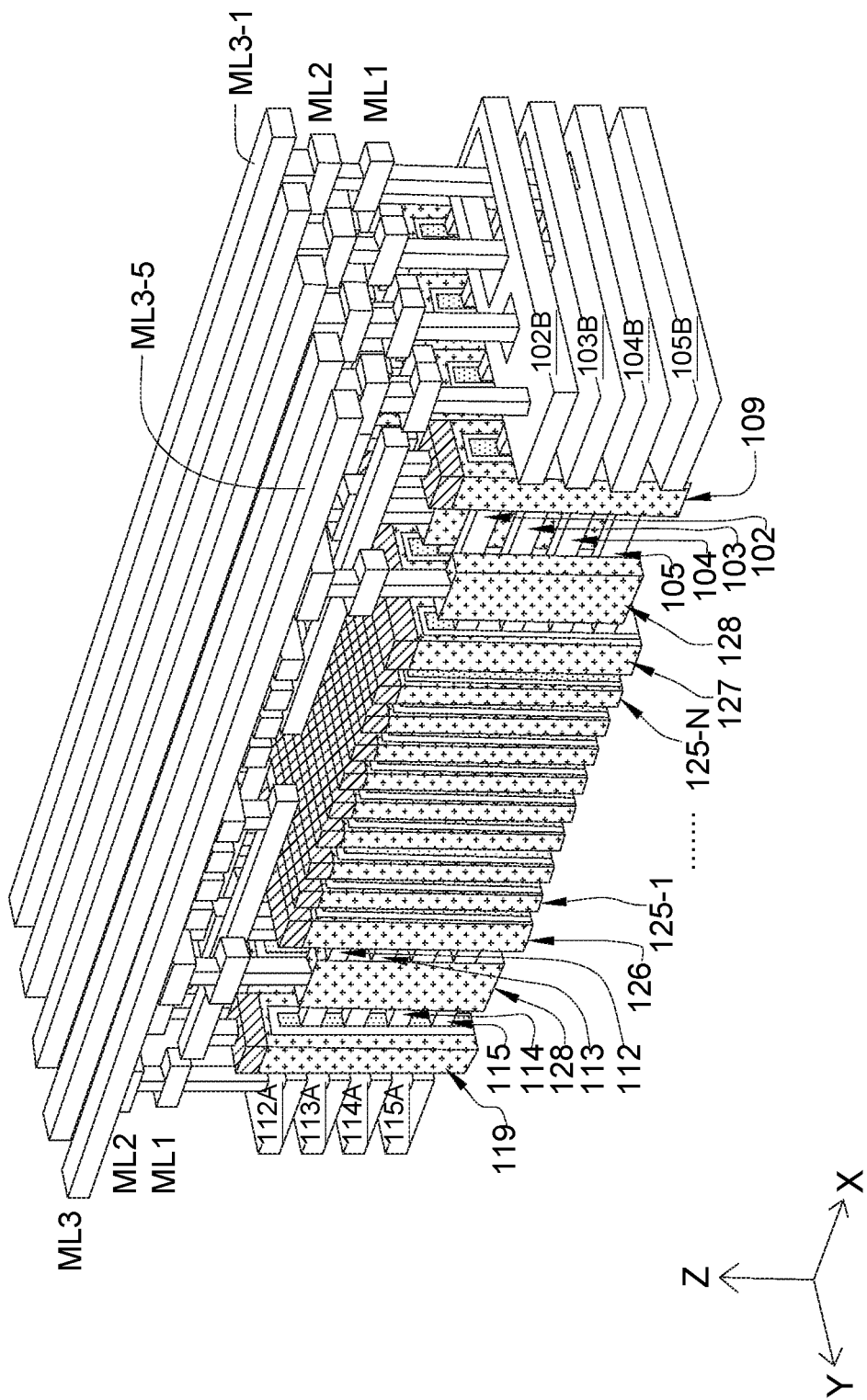
FIG. 1A shows a schematic diagram of a semiconductor structure according to an embodiment of present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1B:
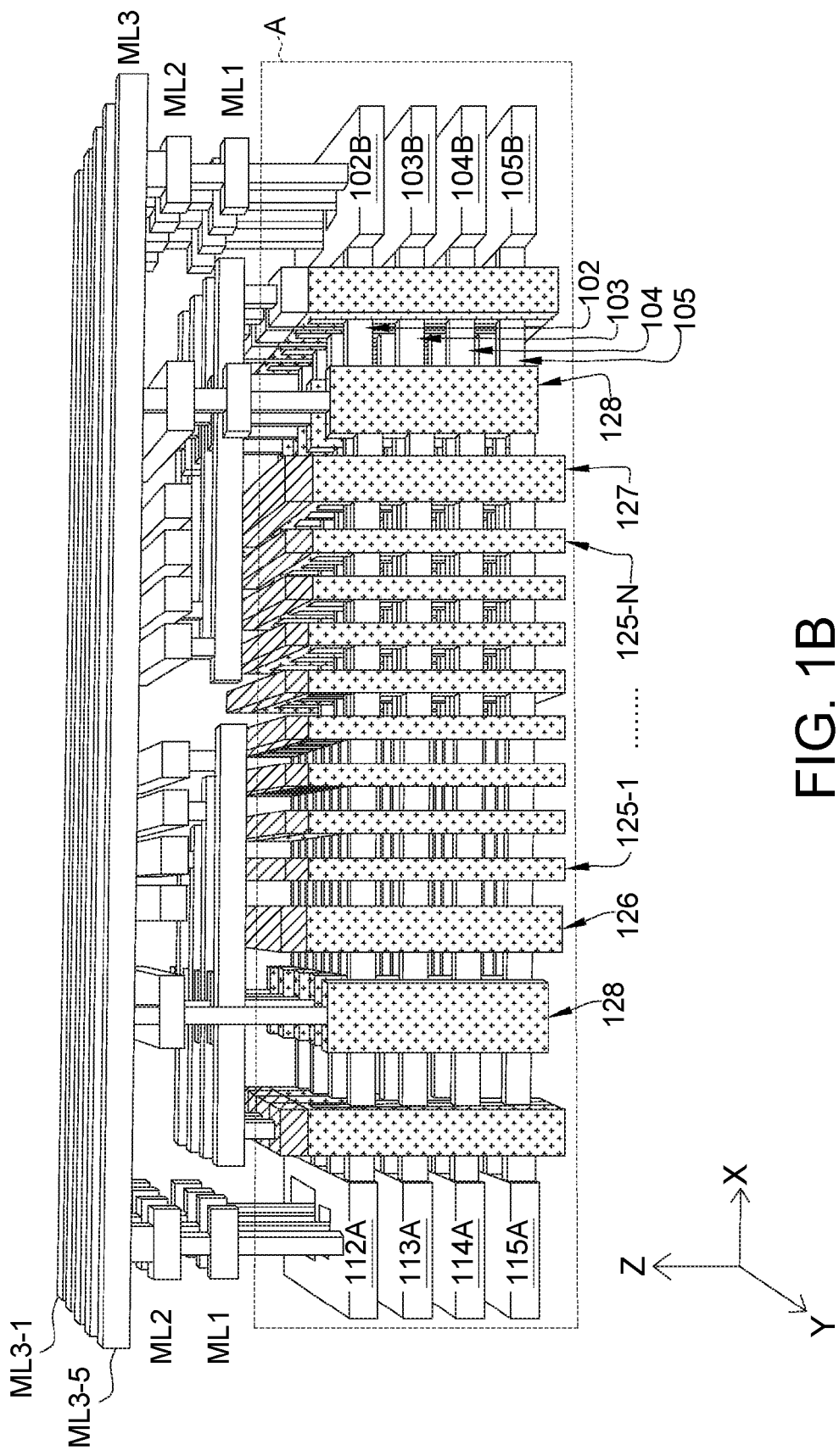
FIG. 1B is side illustrations of the semiconductor structure shown in FIG. 1A.

Referring to FIGS. 1A and 1B, FIG. 1A shows a schematic diagram of a semiconductor according to an embodiment; FIG. 1B is side illustrations of the semiconductor structure shown in FIG. 1A. Semiconductor structure 1 is a 3D NAND-flash memory device with finger vertical gate (Finger VG). The Finger VG structure is described in U.S. Pat. Nos. 8,383,512 and 8,503,213, which is commonly owned by the assignee of the present application and incorporated by reference herein. Insulating material in semiconductor structure 1 is removed from the drawing to expose additional structure. For example, insulating layers are removed between the semiconductor strips, in the ridge-shaped stacks, and are removed between the ridge-shaped stacks of semiconductor strips.

As shown in FIGS. 1A and 1B, the multilayer array is formed on an insulating layer, and includes a plurality of word lines 125-1 to 125-N conformal with the plurality of bit line stacks. The bit line stacks includes semiconductor strips 112, 113, 114, 115. Semiconductor strips in the same plane are electrically coupled together by staircase structures 112A, 113A, 114A, 115A.

Staircase structures 112A, 113A, 114A, 115A terminate semiconductor strips 112, 113, 114, 115. Staircase structures 1028, 1038, 104B, 1056 terminate semiconductor strips 102, 103, 104, 105. As illustrated, these staircase structures 1028, 1036, 1046, 105B, 112A, 113A, 114A, 115A are electrically connected to different bit lines for connection to decoding circuitry to select planes within the array.

Any given bit line stack is coupled to either the staircase structures 112A, 113A, 114A, 115A, or the staircase structures 102B, 103B, 104B, 105B, but not both.

The bit line stack including semiconductor strips 112, 113, 114, 115 is terminated at one end by the staircase structures 112A, 113A, 114A, 115A, passes through SSL gate structure 119, gate select line GSL 126, word lines 125-1 through 25-N, gate select line GSL 127, and terminated at the other end by source line 128. The bit line stack including semiconductor strips 112, 113, 114, 115 does not reach the staircase structures 102B, 103B, 104B, 105B.

Similarly, the bit line stack including semiconductor strips 102, 103, 104, 105 is terminated at one end by the staircase structures 102B, 103B, 104B, 105B, passes through SSL gate structure 109, gate select line GSL 127, word lines 125-N through 125-1, gate select line GSL 126, and terminated at the other end by a source line (See FIG. 1B). The bit line stack including semiconductor strips 102, 103, 104, 105 does not reach the staircase structures 112A, 113A, 114A, 115A.

Metals layers ML1, ML2, and ML3 are formed on the array of bit line stacks and word line 125-1-125-N. The second metal layer ML2 includes two source lines (corresponding to source line 128). The orientation of ML2 (y-axis) is parallel to that of word line. The third metal layer ML3 includes bit lines and ground lines. The orientation of ML3 (x-axis) is parallel to that of bit line stacks. In FIGS. 1A and 1B, there are five third metal layers ML3 in the semiconductor structure. Five ML3s are denoted as ML3-1 ML3-5 respectively. The rightmost ML3 in FIG. 1A is denoted as ML3-1, and the leftmost ML3 in FIG. 1B is denoted as ML3-5. ML3-1-ML3-4 act as bit lines and are electrically connected to different steps of the staircase structures 112A, 113A, 114A, 115A and 102B, 103B, 104B, 105B. These ML3 bit lines allow a bit line signal to select a particular horizontal plane of semiconductor strips. Third metal layer ML3-5 act as ground line and do not contact to staircase structure 112A, 113A, 114A, 115A or 102B, 103B, 104B, 105B. ML3-5 connects to the bit line stack, which comprises semiconductor strips 112, 113, 114, 115. In this embodiment, third metal layer lines ML3 have the same size and pitch and can be simultaneously formed in one lithography process. The structure correlation of ground lines is different from that of bit lines.

FIGS. 2A-2D illustrate a process of manufacturing the semiconductor structure according to an embodiment. The embodiment comprises two semiconductor structures 1 in FIGS. 1A and 1B, which arranged continuously. FIGS. 2A-2D is shown as the top view of the semiconductor structure. This structure can significantly diminishes diminish the area of ground lines but keeps lower body effect of the structure.

Figure 2A:
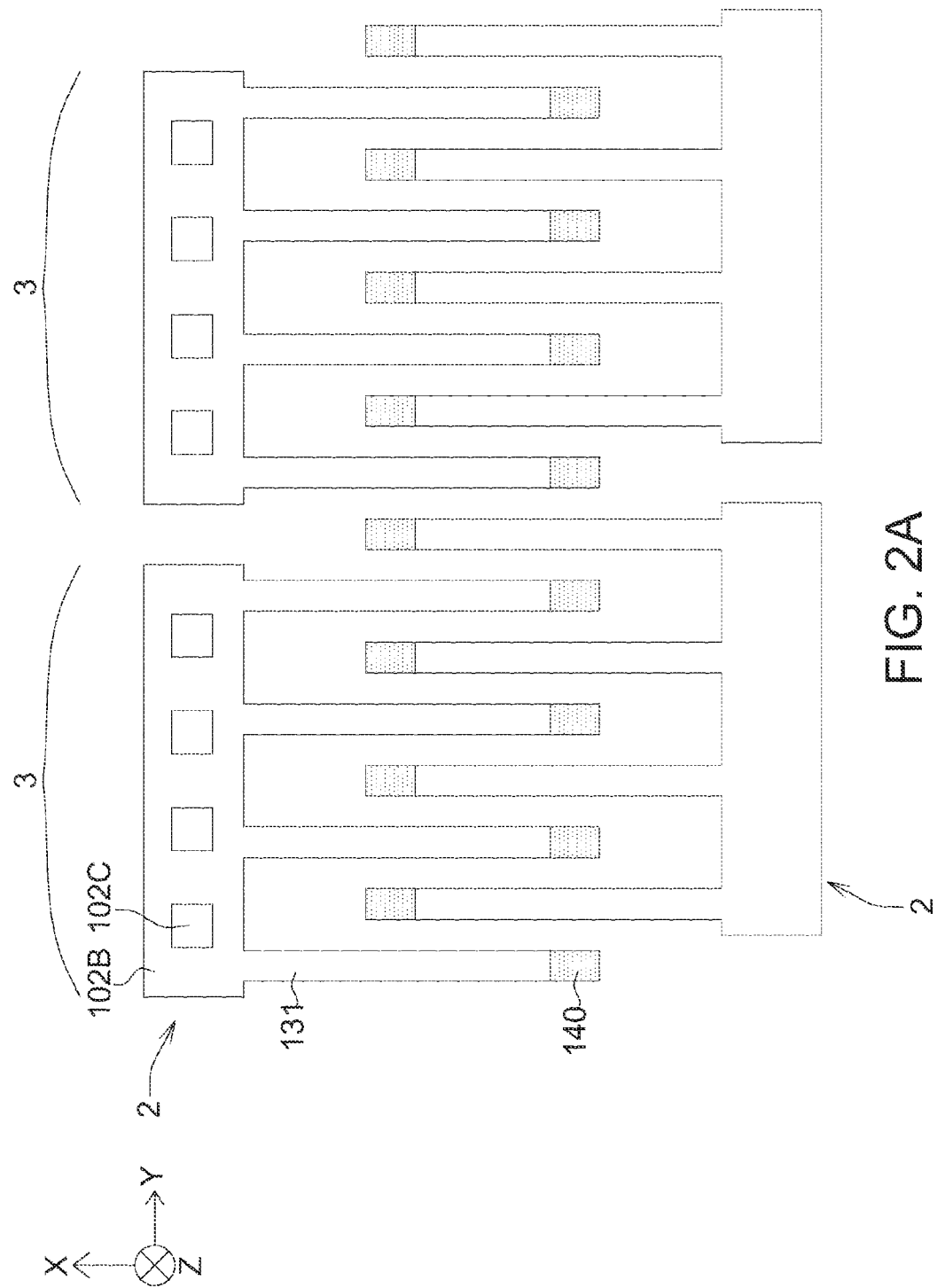
FIG. 2A-FIG. 2D depict a process of manufacturing the semiconductor structure according to an embodiment.
Figure 2B:
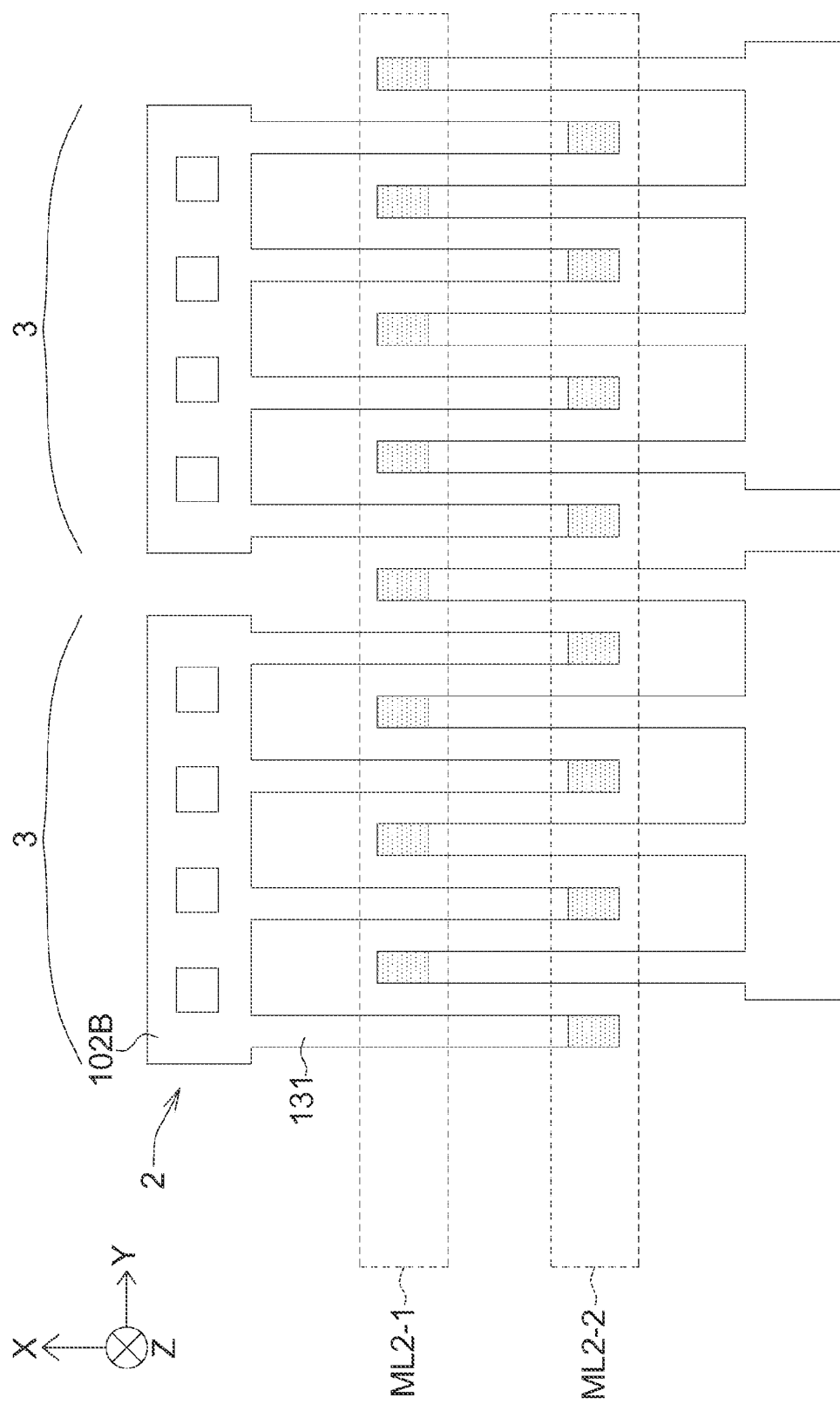

As shown in FIG. 2A, the semiconductor includes two stacking blocks 3 connected in series. The stacking block 3 is the region A in FIG. 2B, which is semiconductor structure 1 except first to third metal layer (ML1-ML3). The stacking block in FIG. 2A removes the structure in y-axis orientation (such as word line 125-1-125-N).

Referring to FIGS. 1B and 2A, finger VG structure 2 includes a staircase structure (since FIG. 2A is top view, only the top of staircase structure 102B is shown) and a plurality of bit line stacks 131. The orientation of staircase structure 102B is y axis, and the orientation of bit line stacks 131 is x axis. The staircase structure 102B and bit line stacks 131 are perpendicular to each other. The contact areas 102C is formed in the staircase structure 102B. The number and pitch of contact areas 102C is corresponding to that of the bin line stacks 131. In this embodiment, there are four bit line stacks 131 connected to the staircase structure 102B, but the disclosure is not limited thereto. In other embodiment, the number of the bit line stacks may be various. The staircase structure 102B can be compared as the palm of the hand, and the bit line stacks 131 can be compared as the fingers of the hand. End of the bit line stacks (finger tip) are source contact 140. Thus, this hand-like structure is called finger VG structure. The stacking block 3 in FIGS. 1B and 2A can be formed by disposing two fingers VG oppositely and letting its bit line stacks 131 be alternately arranged.

As shown in FIG. 2A, stacking block 3 is formed of two finger VG structure. The pitch between two adjacent contact areas of a single finger VG 2 is 2F (original pitch between two adjacent bit line stacks 131), and the pitch between two adjacent bit line stacks 131 of a stacking block 3 is F. That is, assembling two finger VG 2 to a stacking block 3 can reducing the pitch between adjacent bit line stacks 131 (50%), while the pitch between adjacent contact areas 102C remains the same. Thus, the accuracy and precision requirement of the manufacturing process can be reduced. In one embodiment, the pitch 2F between the adjacent contact areas 102C is 75 nm or less. Bit line stacks can be used as memory cell, which is capable of saving data when voltage applied. Therefore, the storage capacity of semiconductor structure can be increased by connecting more stacking blocks in series to add the number of memory cell.

As shown in FIG. 23, forming second metal layer ML2 on the source contact 140. ML2 has a y-axis orientation, which is perpendicular to the bin line stacks 131. ML2 is electrically connected to the source contact 140 of the bit line stacks 131, and can act as a source line. In this embodiment, the semiconductor structure includes two second metal layer ML2-1 and ML2-2 (see FIG. 1B, ML2 above the source line 128). ML2-1 is connected to bit line stacks 131 in the lower part of FIG. 2B, and ML2-2 is connected to bit line stacks 131 in the upper part of FIG. 2B.

Figure 2C:
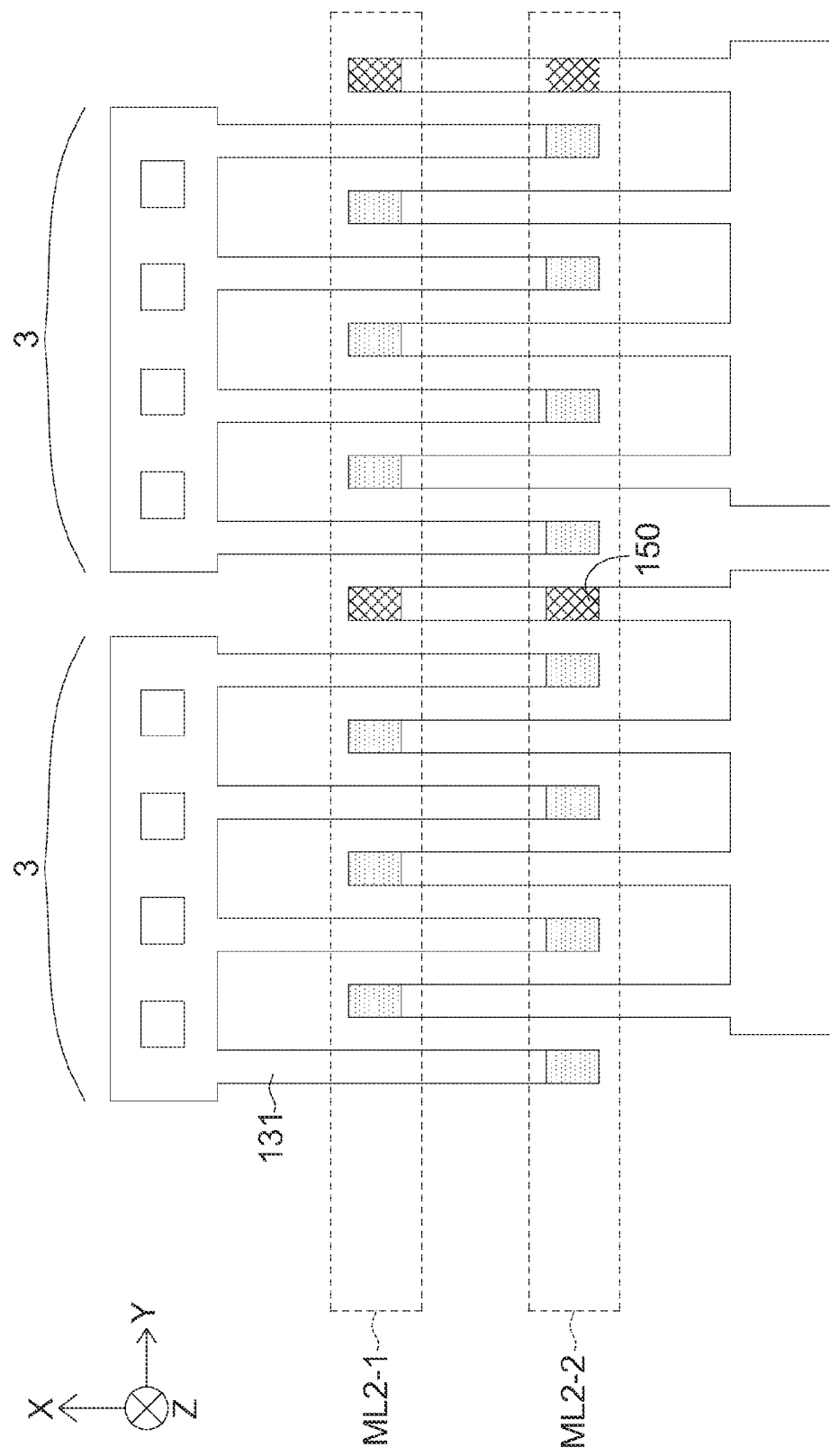

As shown in FIG. 2C, forming via 150 in the second metal layer ML2. Via 150 penetrates the second metal layer ML2 and exposes the bit line stacks 131 underlying ML2. In detail, via 190 exposes every semiconductor strips (such as 102, 103, 104, 105, 112, 113, 114, 115 in FIGS. 1A and 1B) in bit line stacks 131.

Figure 2D:
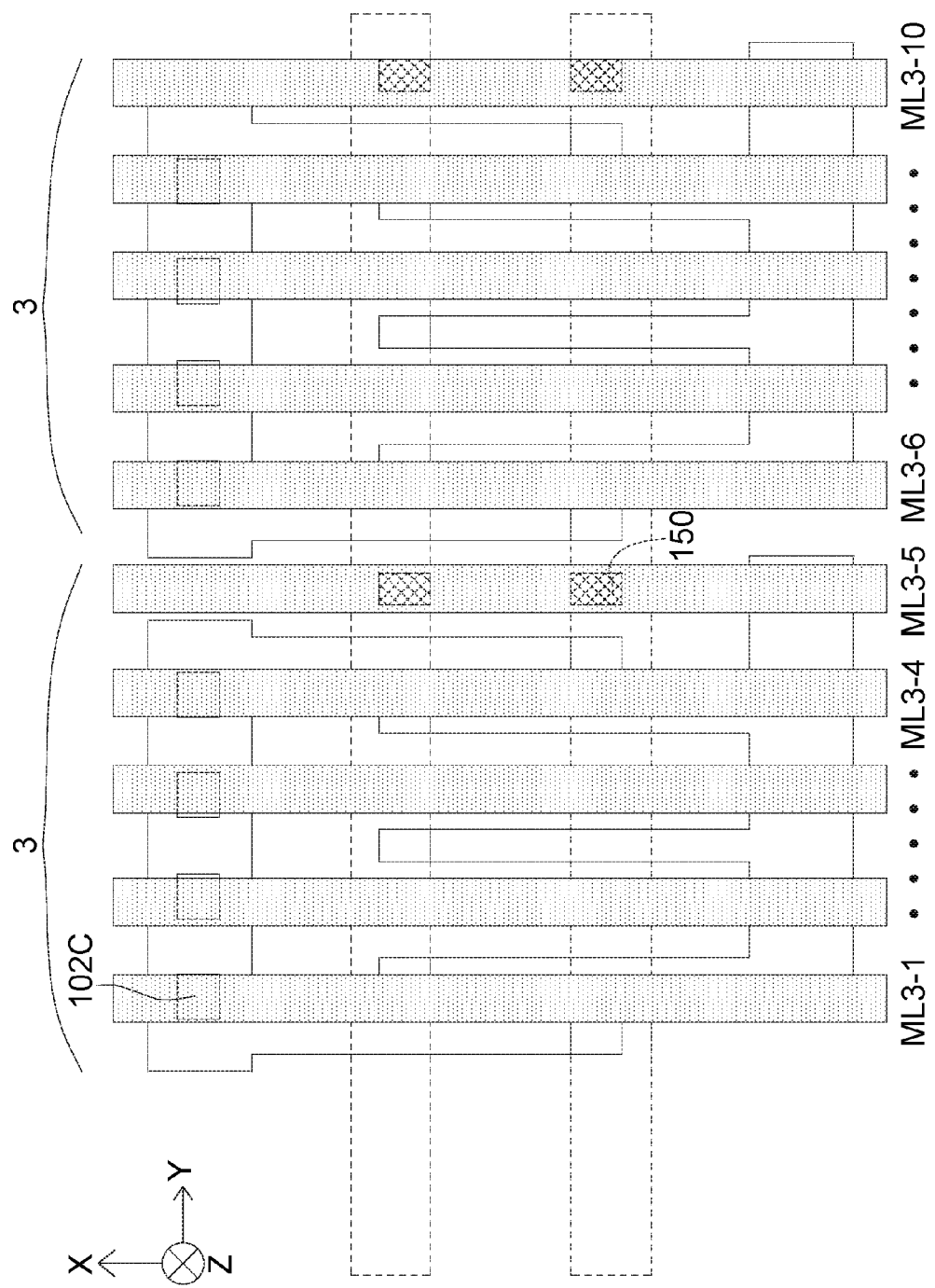

As shown in FIG. 2D, forming a plurality of third metal line ML3-1-ML3-10 on the ML2, and then accomplish the semiconductor structure of the embodiment. Third metal line ML3 has an x-axis orientation, which is parallel to bit line stacks 131 and perpendicular to second metal layer ML2. Third metal layer ML3 is made of conductive material and can act as bit line and ground line of the semiconductor structure. In FIG. 2D, the line coupling to contact areas 102C of the finger VG 2 (ML3-1-ML3-4 and ML3-6-ML3-9) is act as bit line of the semiconductor structure; the line coupling to the via 150 of the second metal layer ML2 (ML3-5 and ML3-10) is act as ground line of the semiconductor structure. In this embodiment, 4 bit lines in each stacking block 3 share the same ground line. The arrangement of semiconductor can assure each stacking block 3 has at least one ground line, thereby diminish the body effect.

In FIG. 2D, bit line and ground line of semiconductor structure 4 are formed simultaneously and have the same pitch and width. The ground lines only occupy few spaces of semiconductor structure. By modifying the huge ground to a lot of small ground line, the ground lines and the bit lines can be formed in one process, and the area taken by ground line is diminished, which is capable of reducing process time and the manufacturing cost. In addition, since the size and pitch of bit lines and ground lines are the same, the electrical property of the bit line being adjacent to ground line will not be significant effect. Thus, it is not necessary to disposed dummy line near the ground line.

It is notable that bit line is not replaced by ground line in this embodiment. The embodiment introduces an extra ground line via circuit design. For example, the original stacking block may 3 only has 4 third metal layers ML3 (ML3-1-ML3-4 in FIGS. 1A and 2D). The pitch of ML3 is 2F. The additional ML3 (ML3-5) will reduce the pitch of ML3 to 8/5F (2F*4/5), for example. The pitch of ML3 can be modulated by changing the position of contact area 102C.

In addition, the embodiment describes above takes 3D memory device with finger VG structure for example, but the disclosure is not limit thereto. The semiconductor structure can be use for other 2D or 3D memory device.

Figure 3:
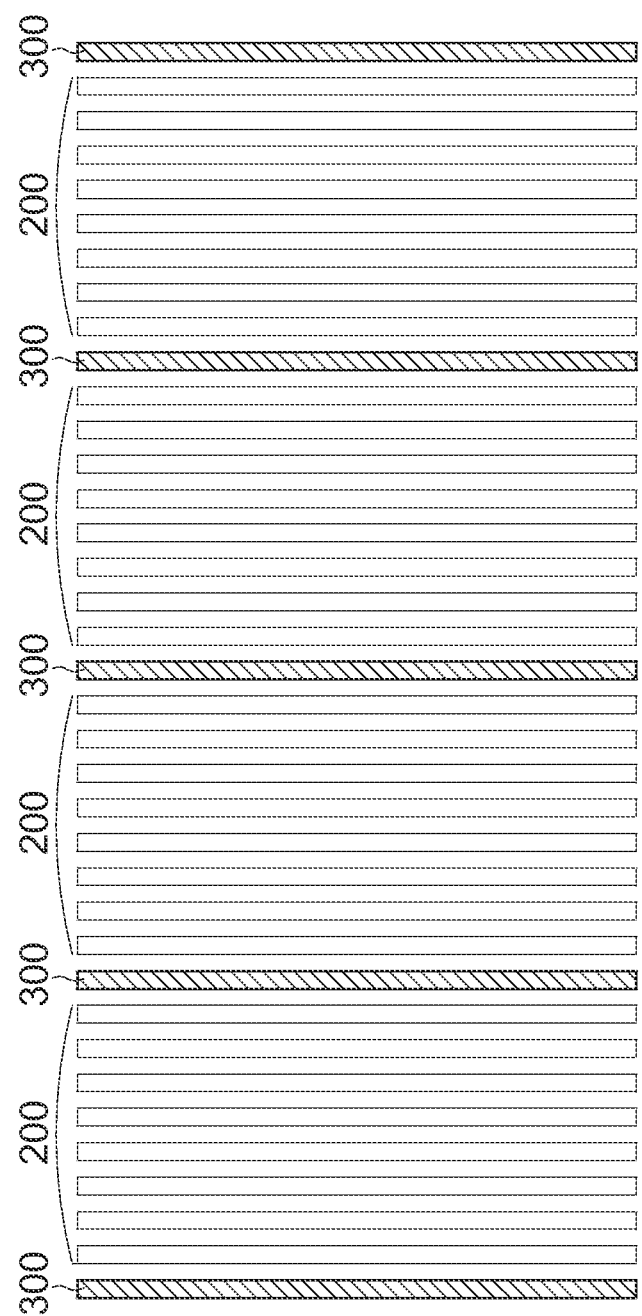
FIG. 3 shows a simplified schematic diagram of a semiconductor structure according to an embodiment.

FIG. 3 shows a simplified schematic diagram of a semiconductor structure according to an embodiment. Bit lines 200 and ground lines 300 are disposed on a memory cell(not shown) upon a substrate (not shown). The number of bit lines is larger than ground line, so many bit lines 200 share one ground line 300. There are 8 bit lines sharing the same ground line in this embodiment. The actual number can vary with demand. In one embodiment, the ratio of the bit lines to the ground lines is equal or below to 128:1, which means at most 128 bit lines share a ground line.

Besides, the pitch between adjacent bit lines and that between bit line and ground line are the same. In one embodiment, the pitch is equal or below to 75 nm, but the disclosure is not limited thereto.

By sharing one ground line with many bit lines, the above embodiments can diminish the body effect and keep good electrical property of semiconductor structure. Further, the area taken by ground line is diminished, which is capable of reducing process time and the manufacturing cost of semiconductor structure.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A semiconductor structure, comprises:
   a substrate;
   a plurality of bit line stacks disposed on the substrate and arranged along a first direction, wherein each of the bit line stacks extends along a second direction perpendicular to the first direction; and
   a plurality of conductive lines, disposed on and parallel with the bit line stacks, wherein the conductive lines are parallel to each other and are spaced apart at a fixed interval,
   wherein the conductive lines include a plurality of bit lines and a plurality of ground lines, and the conductive lines are electrically connected to the bit line stacks.

2. The semiconductor device according to claim 1, wherein a ratio of the bit lines to the ground lines is equal or below to 128:1.

3. The semiconductor device according to claim 1, wherein the fixed interval between two adjacent conductive lines is equal or below to 75 nm.

4. The semiconductor device according to claim 1, wherein widths of the conductive lines are the same.

5. The semiconductor device according to claim 1, wherein a number of bit lines between two adjacent ground lines is the same.

6. The semiconductor device according to claim 1, wherein the conductive lines consist of the bit lines and the ground lines.

7. The semiconductor device according to claim 1, wherein a number of the bit lines is larger than a number of the ground lines.

* * * * *